United States Patent [19]
Kim

[11] Patent Number: 5,892,835
[45] Date of Patent: Apr. 6, 1999

[54] VOLUME CONTROLLER USING ENCODER

[75] Inventor: Kwang-Su Kim, Suwon, Rep. of Korea

[73] Assignee: SamSung Electronics Co., Ltd., Suwon, Rep. of Korea

[21] Appl. No.: 850,719

[22] Filed: May 2, 1997

[30] Foreign Application Priority Data

May 2, 1996 [KR] Rep. of Korea .................... P96-14253

[51] Int. Cl.$^6$ ..................................................... H03G 3/00
[52] U.S. Cl. ............................................................ 381/109
[58] Field of Search .................................. 381/109, 104, 381/106, 107, 108; 341/35

[56] References Cited

U.S. PATENT DOCUMENTS 5,608,793  3/1997  Uriya ....................................... 381/109
5,745,057  4/1998  Sasaki et al. ............................ 381/109

*Primary Examiner*—Vivian Chang
*Attorney, Agent, or Firm*—Robert E. Bushnell, Esq.

[57] ABSTRACT

The volume controller of the present invention does not require a use of an expensive main controller and a quartz oscillator to generate the pulse signals for regulating the volume. The volume controller can handle the noise generated by turning of an encoder and regulates the volume accurately despite the noise. As the volume is increased, a first pulse signal generating circuitry generates pulse signals with an already established width according to the pulse signals of the encoder. As the volume is decreased, a second pulse signal generating circuitry generates pulse signals with already established width according to the pulse signals of the encoder. The first or the second pulse signal generating circuitry will act optionally according to the increase or decrease of the volume. When the first or the second pulse generating means are optional and yet generates the pulse signal, the control means will disconnect the standard terminal of the encoder that is not to be grounded. This will keep the encoder from generating the pulse signal. And the volume removal integrated circuit will regulate the volume according to the pulse signal of the first or the second pulse signal generating circuitry.

16 Claims, 9 Drawing Sheets

VOLUME CONTROLLER USING ENCODER

CLAIM OF PRIORITY

This application makes reference to, incorporates the same herein, and claims all benefits accruing under 35 U.S.C. §119 from an application entitled Volume Controller Using Encoder earlier filed in the Korean Industrial Property Office on May 2, 1996 and there duly assigned Serial No. 96-14253 by that Office.

BACKGROUND OF THE INVENTION

1. Field of the Invention

This invention relates to a volume controller using an encoder regulating the level of the voice signal in the voice output machines which sends voice signals. More particularly, this invention finds application in devices such as a television or an audio system.

2. Description of the Prior Art

Typically, an audio signal generating machine such as a television or an audio system sending voice signals usually have volume controllers to regulate the level of the voice signal. Conventionally, variable resistors have been used to regulate the volume of the voice output machines. However, in using the above mentioned variable resistors some problems arose. As time passed by, foreign substances such as dust may collect. Due to this problem, when regulating the volume, contact errors happen and noises are heard. This gives the user an unpleasant experience, and it will also not be possible to regulate the volume accurately. Therefore, encoders have much been used recently in order to regulate the volume correctly and to get rid of the noise in the voice signal even if there will be noises due to the piled foreign substances like dust.

Another of the contemporary solutions have been to provide a main controller judging the increase of the volume according to the phase difference of the two pulse signals put in from the encoder. Some of these systems require that volume control integrated circuit regulates the volume according to the number of the pulse signals generated by the encoder. Many of these systems regulate the volume directly according to the user turning the turning knob of the encoder. However, they require an expensive main controller and an expensive quartz oscillator. The cost of the production will be increased, and the consumer has to bear the economic expenses. The challenge is to provide an effective volume controller using encoder to regulate the volume without using an expensive main controller and an expensive quartz oscillator. This can be done through the various embodiments of the volume controllers of the present invention, some of which use separate pulse generating circuitry for increasing and decreasing volume.

SUMMARY OF THE INVENTION

Therefore, an object of this invention is to provide an improved and effective volume controller using encoder to regulate the volume without using an expensive main controller and a quartz oscillator.

Another object of this invention is to provide a volume controller using encoder to regulate the volume accurately without incorporating false movement when noises such as chattering occur, especially when the encoder is being used (such as being turned and tuned).

To achieve these and other objects, this invention may include a first pulse generating circuitry generating pulse signals with already established width moving according to the output signals of the encoder in case the volume will be increased and a second pulse generating circuitry generating pulse signals with already established width moving according to the output signals of the encoder in case the volume will be decreased. The first pulse generating circuitry or the second pulse generating circuitry may move optionally according to the regulation of the volume. When the first pulse generating circuitry or the second pulse generating circuitry is generating pulse signals, but this generating is optional, the controller may disconnect the standard terminal of the above mentioned encoder that is not to be grounded. The pulse signals will not be generated without the influence of the turning of the turning knob.

The volume control integrated circuit may regulate the volume according to the output signal of the first pulse generating circuitry and the second pulse generating circuitry. Therefore, when the user is turning the turning knob of the encoder and there are noises, the output signal of the first pulse generating circuitry and the second pulse generating circuitry will not have noise and will regulate the volume accurately.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
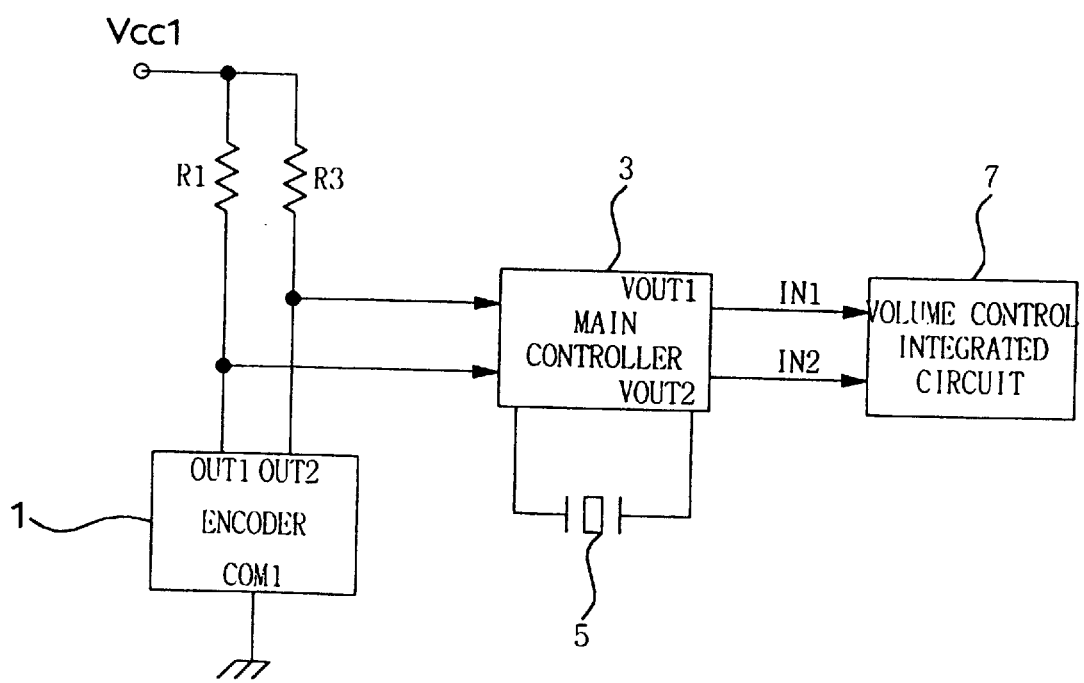
FIG. 1 is a circuit diagram illustrating the contemporary volume controller.

FIG. 1, a circuit diagram, shows the structure of the contemporary volume controller regulating the volume by using an encoder. Encoder (1) regulates the volume. The encoder consists of a turning knob (not shown in the figure) which will be turned in the clockwise or counter-clockwise direction by the user in regulating the volume, a standard terminal (COM) connected to the ground, a first output terminal (OUT1) approved through the load resistor (R1) (R3) of the power (Vcc1) and a second output terminal (OUT2). As the user turns the turning knob, the above mentioned first output terminal (OUT1) and the second output terminal (OUT2) will be connected to the standard terminal (COM) optionally with the phase difference of 90 degrees. Therefore, the encoder puts out the pulse signal with a phase difference of 90 degrees between the above mentioned first output terminal (OUT1) and the second output terminal (OUT2) according to the direction of the turning knob by the user.

The encoder (1) puts out pulse signals to the first output terminal (OUT1) and the second output terminal (OUT2) with a cycle varying according to the speed of the turn of the turning knob by the user. The first output terminal (OUT1) and the second output terminal (OUT2) of the above is mentioned encoder (1) and the connection point of the above mentioned resistor (R1) (R3) will be connected to the input terminal of the main controller (3). The above mentioned main controller (3) moves according to the clock signal of the oscillation of the quartz oscillator. And the above mentioned main controller (3) interprets the phase difference of the pulse signal generated to the first output terminal (OUT1) and the second output terminal (OUT2) of the above mentioned encoder (1). And referring to the interpretation of the above mentioned phase difference the main controller (3) puts out volume control signals to the first output terminal (VOUT1) and the second output terminal (VOUT2). A volume control integrated circuit (7) regulates the volume according to the volume control signal put out by the above mentioned main controller (3).

Figure 2A:
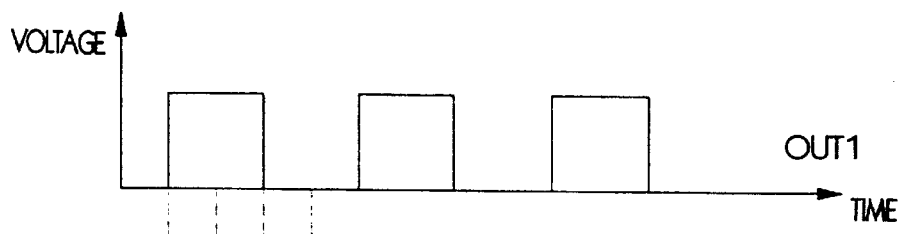
FIGS. 2a and 2d show operational signals of each block of FIG. 1 in a situation in which the volume is increased.
Figure 2B:
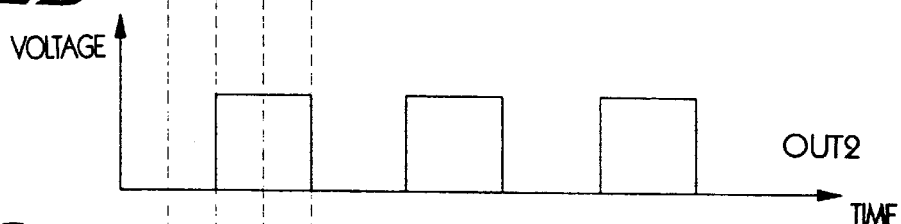

In the contemporary volume controller composed as above mentioned, the user turns the turning knob of the encoder (1) in the clockwise direction when turning up the volume in case the power (Vcc1) is connected. In that case the encoder (1) puts out pulse signals to the first output terminal (OUT1) referring to FIG. 2a and puts out later pulse signals with a phase difference of 90 degrees to the second output terminal (OUT2) than the above mentioned first output terminal (OUT1). That is, is the user turning the turning knob of the encoder (1) fast, the cycle of the pulse signals to the first output terminal (OUT1) and the second output terminal (OUT2) will be shorter. On the other hand, is the user turning the turning knob of the encoder (1) slowly, the cycle of the pulse signals will be longer. The pulse signals put out to the first output terminal (OUT1), and the second output terminal (OUT2) through the above mentioned encoder (1) will be input to the main controller (3).

Figure 2C:
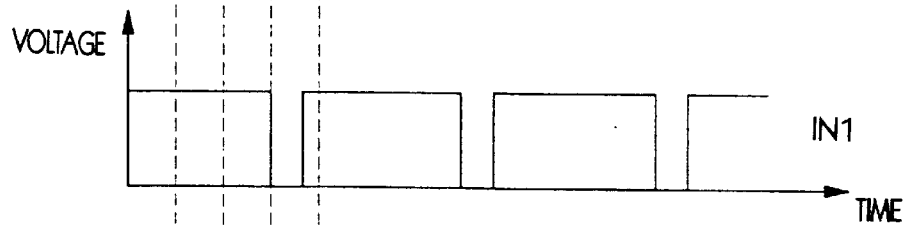
Figure 2D:
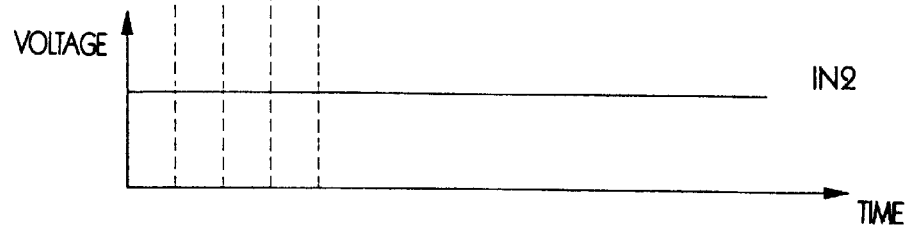
Figure 3A:
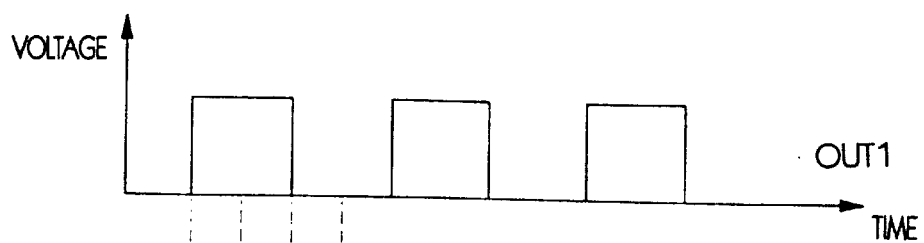
FIGS. 3a and 3d show operational signals on each block of FIG. 1 in a situation in which the volume is decreased.
Figure 3B:
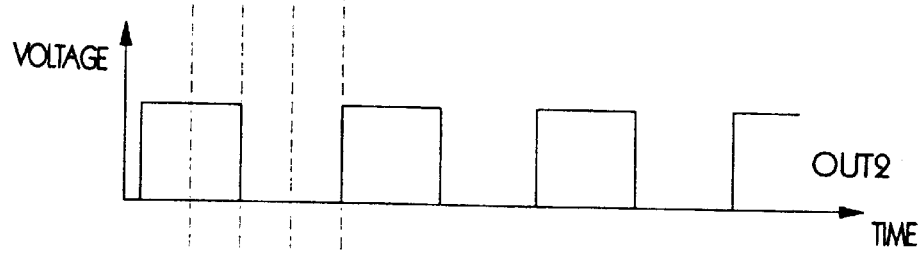
Figure 3C:
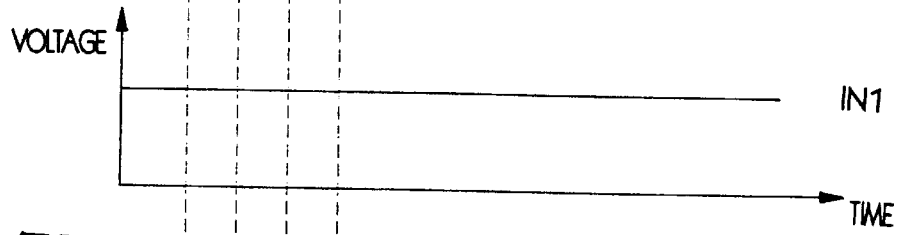
Figure 3D:
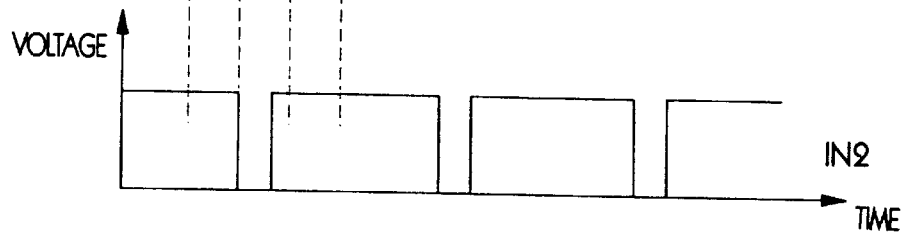

The above mentioned main controller (3) judges the increase of the volume according to the phase difference of the two pulse signals put in from the above mentioned encoder (3), puts out the pulse signals to the first output terminal (VOUT1) in proportion to the number of the pulse signals generated in the above mentioned encoder (1) referring to FIG. 2c, and puts out high voltage to the second output terminal (VOUT2). Volume control signals put out by the main controller (3) will be input to the input terminal (IN1) (IN2) of the volume control integrated circuit (7), and the volume control integrated circuit (7) will increase the volume in proportion to the number of the pulse signals input to the input terminal (IN1). And as the user is turning the turning knob in the counter-clockwise direction in order to turn down the volume, the encoder (1) puts out pulse signals to the first output terminal (OUT1) referring to FIG. 3a, and puts out pulse signals to the second output terminal (OUT2) which has faster phase difference of 90 degrees than the pulse signals sent to the first output terminal (OUT1) referring to FIG. 3b. The main controller (2) judges the decrease of the input volume according to the phase difference of the pulse signals output by the above mentioned encoder (1). It generates high voltage to the first output terminal (VOUT1) referring to FIG. 3c and puts out pulse signals to the second output terminal (VOUT2) in proportion to the number of the pulse signals generated by the above mentioned encoder (1) as shown in FIG. 3d. The volume control signal output by the main controller (3) as shown will be input to the input terminal (IN1) (IN2) of the volume control integrated circuit (7). The volume control integrated circuit (7) will decrease the volume in proportion as the number of the pulse signals input to the input terminal (IN2). In the above mentioned contemporary volume controller the volume control integrated circuit (3) regulates the volume according to the number of the pulse signals generated by the encoder (1). It does not regulates the volume directly according as the user turns the turning knob of the encoder (1). Therefore there will be no noise in the voice signal even if there were noise in the pulse signals generated by the encoder (1).

But as expensive main controller (3) and quartz oscillator (5) has been used, the cost of the production will be increased, and the consumer has to bear the economic expenses. And as the first output terminal (OUT1) and the second output terminal (OUT2) of the encoder (1) are connected to the input terminal of the main controller (3) directly, noises like chattering generated by the connection and opening of the connection point of the encoder (1) in case the encoder (1) will be turned, will be input in the main controller (3), and this again will arise problems like false movement of the main controller (3).

Figure 4:
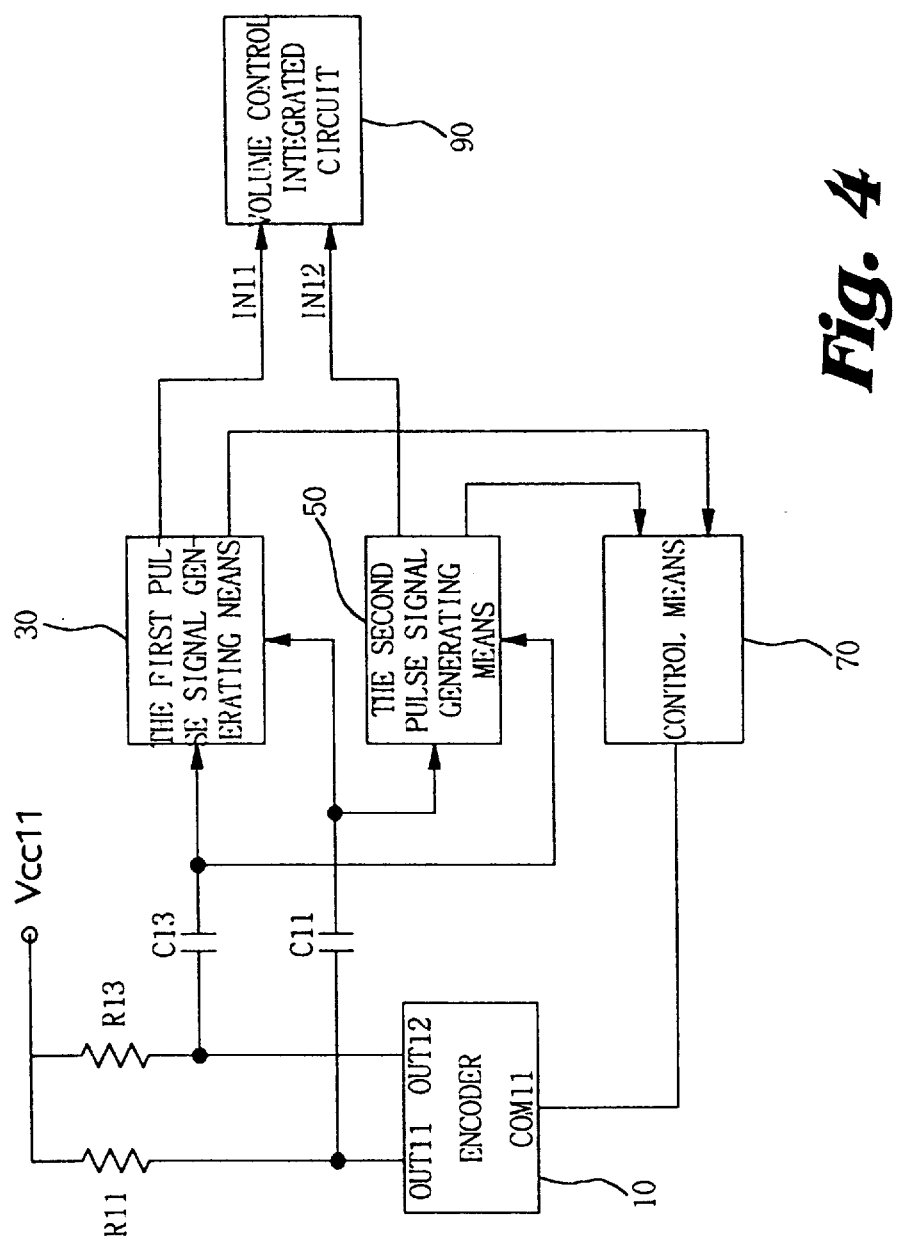
FIG. 4 is a block diagram illustrating the structure of a volume controller constructed according to the principles of the present invention.

A preferred embodiment of the invention will be explained in detail referring to the FIGS. 4 and 7. FIG. 4, a block diagram, shows the structure of another volume controller in this invention.

As shown in FIG. 4, this embodiment of the present invention (hereinafter "this invention") has at least 5 components: an encoder (10) generating pulse signals with the phase difference of 90 degrees between the first output terminal (OUT11) and the second output terminal (OUT12) when the user turns the turning knob, the first pulse signal generating means (30) generating pulse signals according to the output signal of the above mentioned encoder (10) in case the volume will be increased and not generating pulse signals in case the volume will be decreased, a second pulse signal generating means (50) generating pulse signals according to the output signal of the above mentioned encoder (10) in case the volume will be decreased and not generating power in case the volume will be increased, a control means (70) preventing the above mentioned encoder (10) from generating pulse signals when the above mentioned first pulse generating means (30) or the second if pulse generating means (50) will generate pulse signals and a volume control integrated circuit (90) increasing or decreasing the volume according to the pulse signals generated by the above mentioned first pulse signal generating means (30) and the second pulse signal generating means (50).

Figure 5:
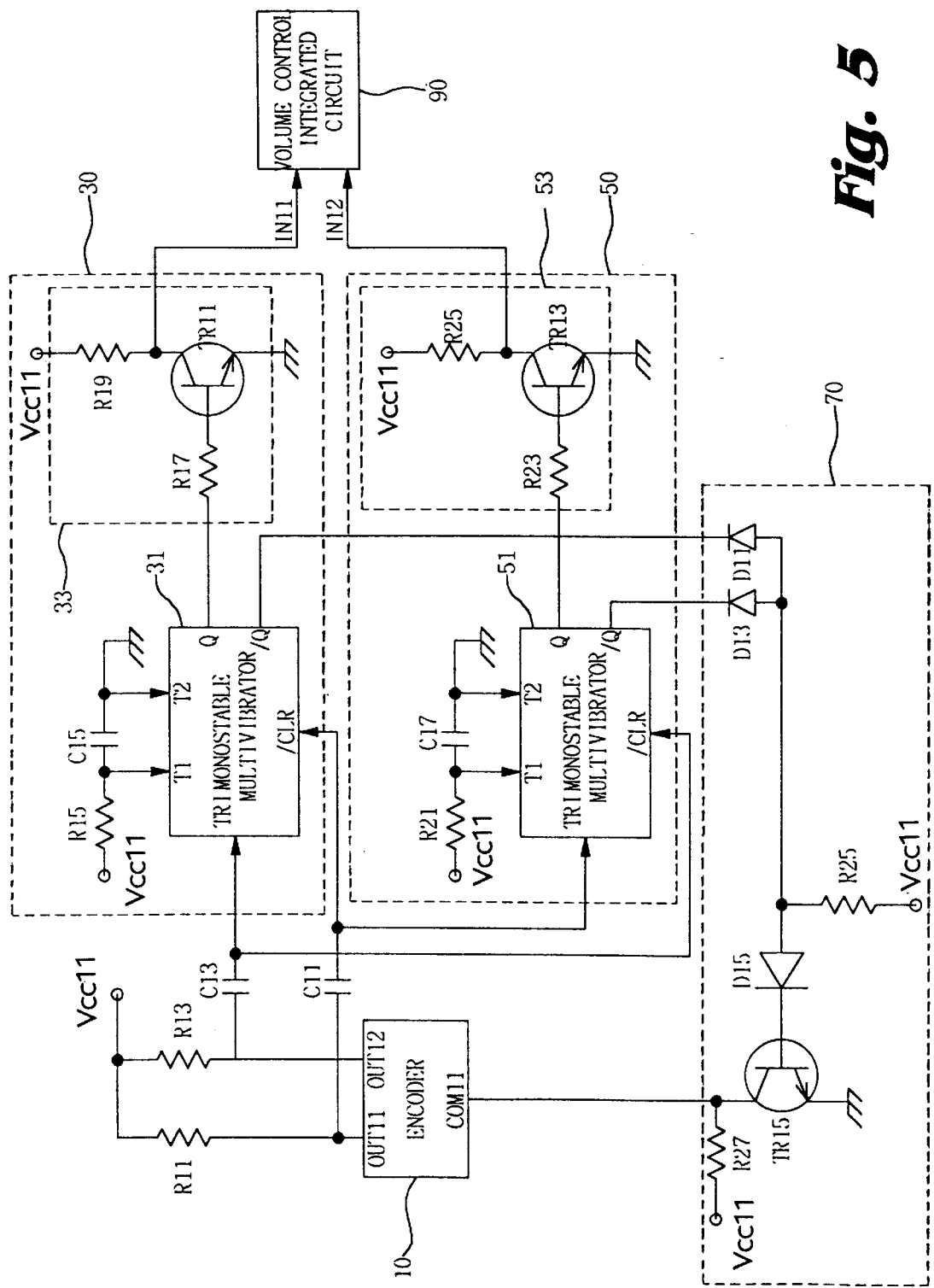
FIG. 5 is a detailed circuit diagram showing the structure of a volume controller constructed according to the principles of the invention.

FIG. 5 is a detailed circuit diagram showing the structure of the volume controller of this invention. As shown in the figure power (Vcc11) will be connected to each output terminal (OUT11) (OUT12) of the encoder (10) through the load resistor (R11) (R13), and at the contact point the one node of the noise-removal capacitor (C11) (C13) will be connected.

In the first pulse generating means (30), the other node of the above mentioned noise-removal capacitor (C11) (C13) will be connected to the clear node (/CLR) and the trigger node (TRI) of the monostable multivibrator (31), the power (Vcc11) will be connected to the time constant terminal (T1) of the above mentioned monostable multivibrator and one node of the capacitor (C15), and time constant terminal (T2) of the monostable multivibrator (31) and the other node of the capacitor (C15) will be grounded. The output terminal (Q) of the above mentioned monostable multivibrator (31) will be connected to the base of the transistor (TR11) through the resistor (R17), and in the collector of the transistor (TR11) the power (Vcc11) will be permitted and connected through the resistor (R19), and at the same time the connection point will be connected to the first input terminal (IN11) of the volume control integrated circuit (90) and the inverter (33) will be formed. In the above mentioned second pulse signal generating means (50), the other node of the above mentioned noise removal capacitor (C11) (C13) will be connected to the trigger terminal of the monostable multivibrator (51) and the clear terminal (/CLR), the power (Vcc11) will be connected to the time constant terminal (T1) of the above mentioned momostable multivibrator (51) and the one node of the capacitor (C17) through the resistor (R21) and the time constant terminal (T2) of the monostable multivibrator (51) and the other node of the capacitor (C15) will be grounded. The output terminal (Q) of the above mentioned monostable multivibrator (51) will be connected to the base of the transistor (TR13) through the resistor (R23), and in the collector of the transistor (TR13) the power (Vcc11) will be permitted and connected through the resistor (R25) and the connected point will be connected to the second input terminal (IN12) of the volume removal integrated circuit (90) and that will compose the inverter (53).

Of the removal means (70), the output terminal (/Q) of the above mentioned monostable multivibrator (31) (51) will be connected to the cathode of the diode (D11) (D13) moving to the AND gate, the power (Vcc11) will be connected to the anode of the diode (D11) (D13) through the resistor (R25), the connected point will be connected to the base of the transistor (TR15) through the diode (D15), the power (Vcc11) will be permitted and connected to the collector of the transistor (TR15) through the resistor (R27) and the connected point will be connected to the standard terminal (COM11) of the above mentioned encoder (10).

In the volume controller of this invention structured as explained, the monostable multivibrator (31) (51) of the first and the second pulse signal generating means (30) (50) will generate high voltage to the output terminal (/Q) in the beginning stage at the state of the power (Vcc11) being permitted. Then, the diode (D11) (D13) of the control means (70) will all be cut off, and the power (Vcc11) will be permitted to the base of the transistor (TR15) through the resistor (R25) and the diode (D15). Consequently, the above mentioned transistor (TR15) will be on, and as the standard terminal (COM11) of the above mentioned encoder (10) will be grounded through the above mentioned transistor (TR15), the above mentioned encoder (10) will act normally. In this state, when the user is turning the turning knob of the above mentioned encoder (10) in the clock-wise direction to increase the volume, the encoder (10) puts out the pulse signals to the first and the second output terminals (OUT11) (OUT12).

Figure 6A:
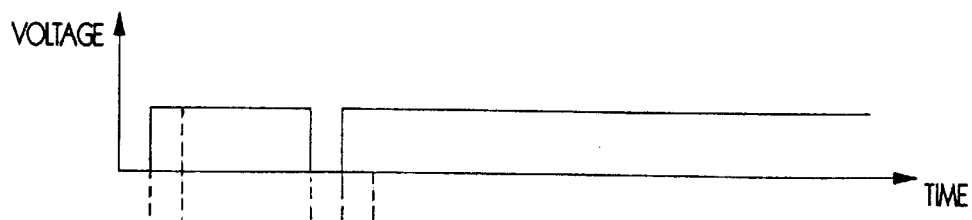
FIGS. 6a and 6h show operational signals on each block of FIG. 5 in a situation in which it the volume is increased.
Figure 6B:
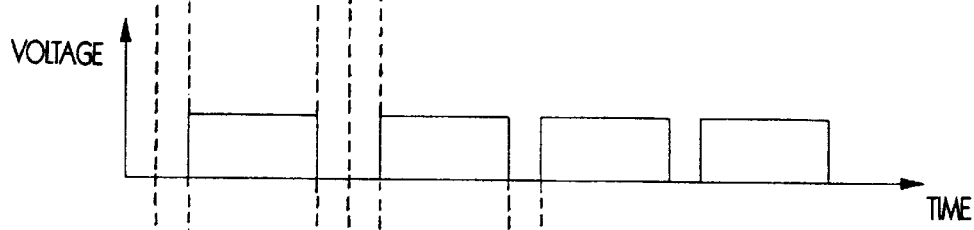

Suppose that at a time t1 the encoder (10) puts out high voltage to the first output terminal (OUT11) as shown in FIG. 6a, and that at a later time t2 with the phase difference of 90 degrees the encoder (10) puts out high voltage to the second output terminal (OUT12) as shown in FIG. 6b. The high voltage put out by the encoder (10) to the first output terminal (OUT1) at a time t1 will be permitted to the clear terminal (/CLR) of the monostable multivibrator (31) in the first pulse signal generating means (31) and to the trigger terminal (TRI) of the monostable multivibrator (51) in the second pulse signal generating means (50). Thereby a low voltage will be put out to the second output terminal (OUT12) of the encoder (10) as shown in FIG. 6b, and the generated low voltage will be permitted to the clear terminal (/CLR) of the monostable multivibrator (51) through the noise removal capacitor (C13). Therefore even if at a time t1 high voltage will be permitted to the trigger terminal (TRI) of the above mentioned monostable multivibrator (51), the monostable multivibrator will not be triggered. The above mentioned monostable multivibrator (51) will put out accordingly the low voltage to the output terminal (Q) as shown in FIG. 6e and will put out the high voltage to the output terminal (/Q) as shown in FIG. 6f. Under this condition the high voltage put out by the above mentioned encoder (10) to the second output terminal (OUT12) will be permitted to the trigger terminal (TRI) of the monostable multivibrator (31) in the first pulse generating means (30) through the noise removal capacitor (C13). Thereby the high voltage will be put out to it the first output terminal (OUT11) of the encoder (10), and as the generated high voltage is permitted to the clear terminal (/CLR) of the monostable multivibrator (31) through the capacitor (C11), the monostable multivibrator (31) will not be cleared and will act normally.

Figure 6C:
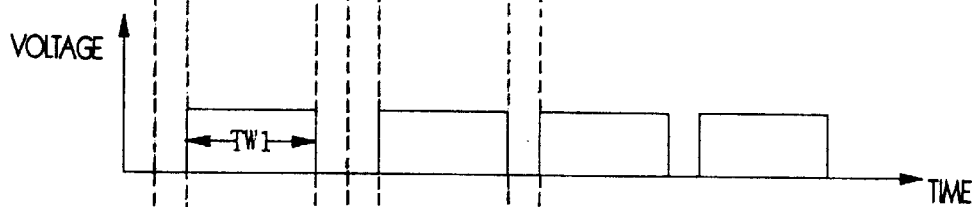
Figure 6D:
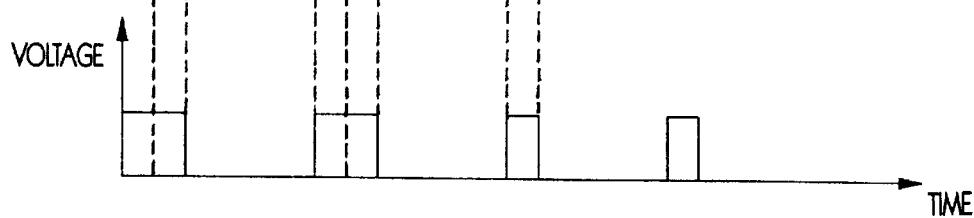
Figure 6E:
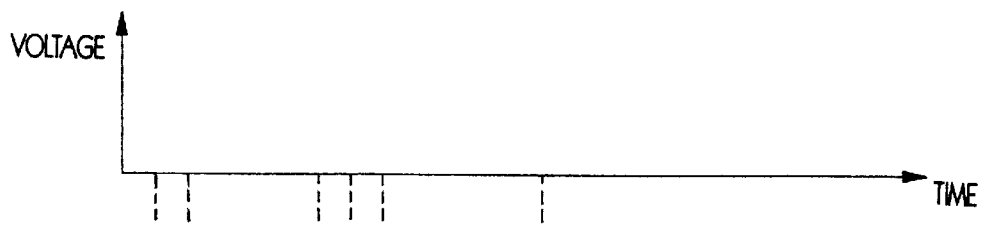
Figure 6F:
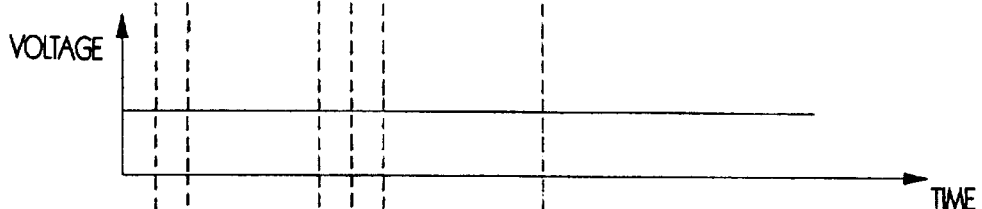
Figure 6G:
Figure 6H:
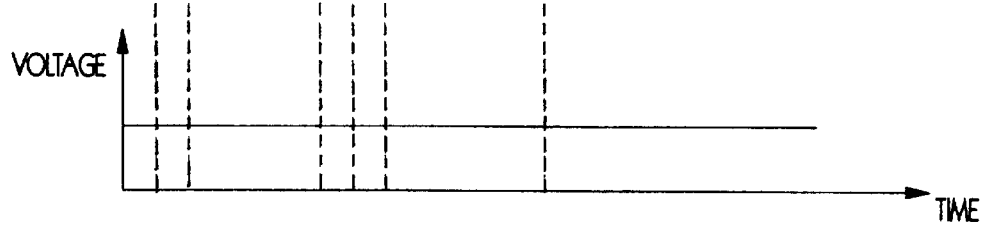

Therefore as the monostable multivibrator (31) is triggered at a time t2, the monostable multivibrator (31) puts out high voltage to the output terminal (Q) as shown in FIG. 6c during the time (TW1) of the time constant established by the cost of the resistor (R15) and the capacitor (C15) and it puts out a low voltage to the output terminal (/Q) as shown in FIG. 6d. As the low voltage puts out to the output terminal (/Q) of the monostable multivibrator (31), the diode (D11) of the controller (70) will conduct, and the low voltage will be permitted to the base of the transistor (TR15), and it will be off as the power (Vcc11) will flow to the output terminal (/Q) of the monostable multivibrator (31) through the resistor (R25) and the diode (D11). When the low voltage is put out to the output terminal (/Q) of the monostable multivibrator (31), the diode (D11) of the controller (70) will conduct, and low voltage will be permitted to the base of the transistor (TR15), and it will be off as the power (Vcc11) will flow to the output terminal (/Q) of the monostable multivibrator (31) through the resistor (R25) and the diode (D11).

And as the standard terminal (COM11) of the encoder (10) is not grounded, the encoder (1) puts out continuously a high voltage to the first and the second output terminal (OUT11) (OUT12) as shown in FIG. 6a and in FIG. 6b at a time (TW1) of the time constant of the above mentioned resistor (R15) and the capacitor (C15) regardless of the fact whether the user turns the turning knob or not. Under this condition at a time t3 when the time constant (TW1) of the resistor (R15) and the capacitor (C15) passes, the monostable multivibrator (31) will again put out a low voltage and a high voltage to the output terminal (Q) (/Q) as shown in FIG. 6c and FIG. 6d. If the user turning continuously the turning knob of the encoder (10) in the clockwise direction under the above mentioned condition, the encoder (10) puts out the pulse signal to the first output terminal (OUT11) and to the second output terminal (OUT12). Here when the time constant (TW11) established in the resistor (R15) and the capacitor (C15) passes, the above mentioned encoder (10) puts out the pulse signal to the first output terminal (OUT11) and to the second output terminal (OUT12) in two different types. That is to say that, on one hand, the high voltage will first be put out from the first output terminal (OUT11) of the encoder (10) and then after the delay of the time with phase difference of 90 degrees high voltage will be put out to the second output terminal (OUT12), and, on the other hand, the high voltage will first be put out from the second output terminal (OUT12) of the encoder (10) and then after the delay of the time with the phase difference of a 90 degrees high voltage will be put out to the first output terminal (OUT11).

Suppose that a high voltage is first put out from the first output terminal (OUT11) of the encoder (10) at a time t4 as shown in the FIG. 6a, and then it will be put out from the second output terminal (OUT12) at a later time t5 with the phase difference of 90 degrees. As the high voltage first is put out by the first output terminal (OUT11) of the encoder (10) at a time t4 as shown in FIG. 6a, the monostable multivibrator (51) will not be triggered as has been explained. Therefore the diode will be cut off, the transistor (TR15) will be on and the encoder (10) will act continuously under normal condition. And as the high voltage is put out from the second output terminal (OUT12) of the encoder (10) at a time t5, the monostable multivibrator (31) will be triggered. And it follows that the monostable multivibrator (31) will put out a high voltage to the output terminal (Q) during the time constant (TW1) as shown in FIG. 6c and it will put out a low voltage to the output terminal (/Q) as shown in FIG. 6d. Therefore, the diode (D11) will conduct, and as the transistor (TR15) is on, the encoder will not act, and a high voltage will be put out to the first output terminal (OUT11) and to the second output terminal (OUT12). And as the high voltage is put out as shown in FIG. 6b at a time t6 from the second output terminal (OUT12) of the encoder (10) after the time constant (TW1) established in the resistor (R15) and the capacitor (C15) passes, the monostable multivibrator (31) will be triggered as has been explained and it puts out a high voltage to the output terminal (Q) at a time constant (TW1) as in FIG. 6c and puts out a low voltage to the output terminal (/Q) as shown in FIG. 6d.

As a low voltage is put out to the output terminal (/Q) of the monostable multivibrator (31), the diode (D11) will conduct, and the transistor (TR15) will be on. Then the encoder (10) will not act, and a high voltage will be put out to the first output terminal (OUT11) and to the second output terminal (OUT12). That is, with turning the turning knob of the encoder (10) in clockwise direction, is the phase difference of the pulse signal generated by the first output terminal (OUT11) faster than that of the pulse signal generated by the second output terminal (OUT12), the monostable multivibrator (31) will be triggered by the pulse signal generated by the second output terminal (OUT12) and it will put out pulse signals with the width of the time constant (TW1) to the output terminal (Q). And since the monostable multivibrator (31) is not triggered, a low voltage will continuously be put out to the output terminal (Q). As has been explained above the pulse signal generated to the output terminal (Q) from the monostable multivibrator (31) and the low voltage generated to the output terminal (Q) from the monostable multivibrator (51) will be turned over and be put out through the transistor (TR11) (TR13) of the inverter (31) (53). As the output signal of the above mentioned inverter (33) (53) is put in to the input terminal (IN11) (IN12) of the volume removal integrated circuit (90), the volume removal integrated circuit (90) will increase the volume in proportion to the number of the pulse signals generated by the inverter (33).

Figure 7A:
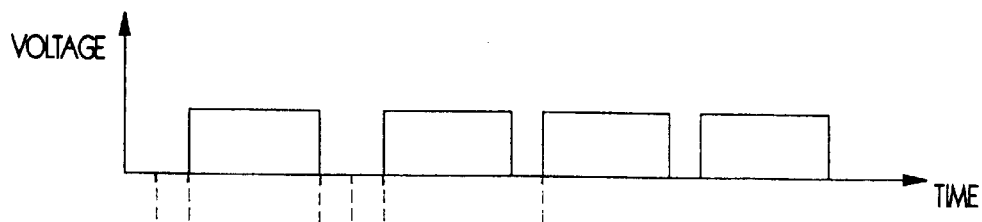
FIGS. 7a and 7h show operational signals on each block of FIG. 5 in a situation in which the volume is decreased.
Figure 7B:
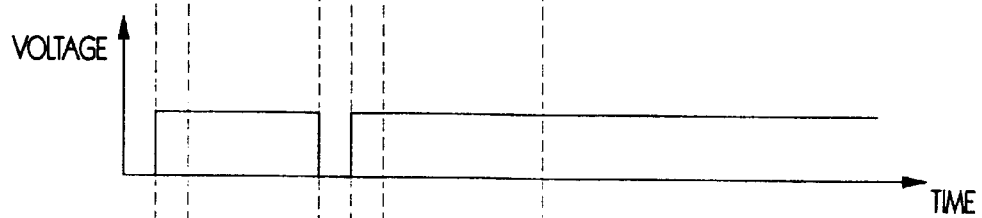
Figure 7C:
Figure 7D:
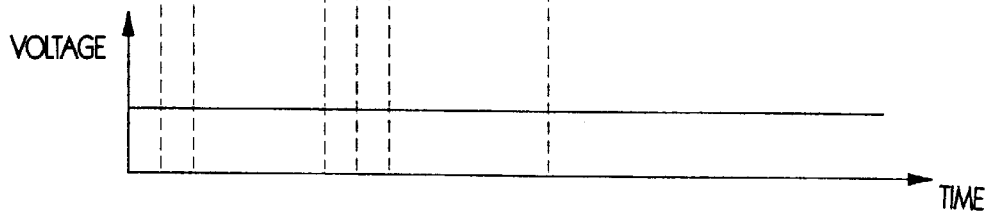
Figure 7E:
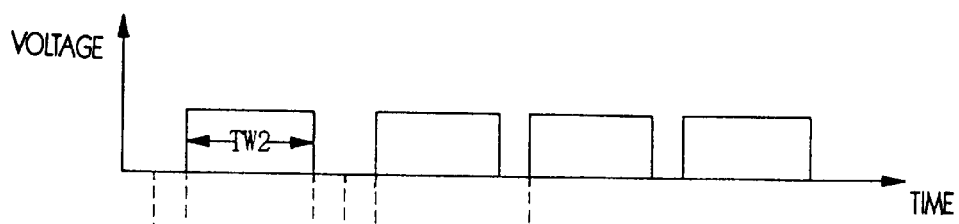
Figure 7F:
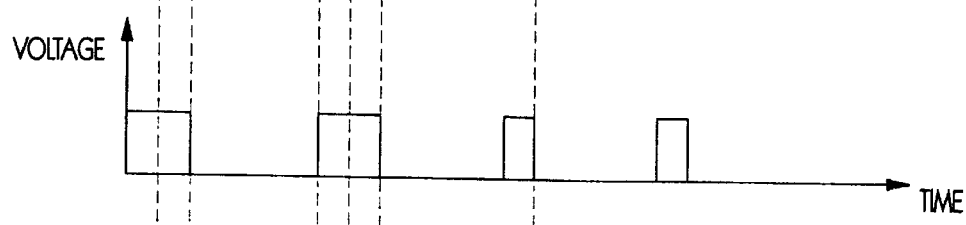
Figure 7G:
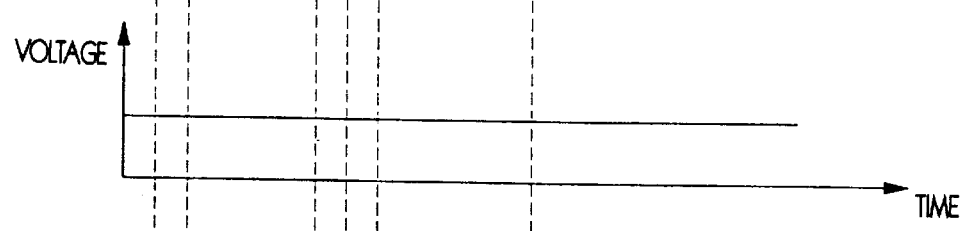
Figure 7H:
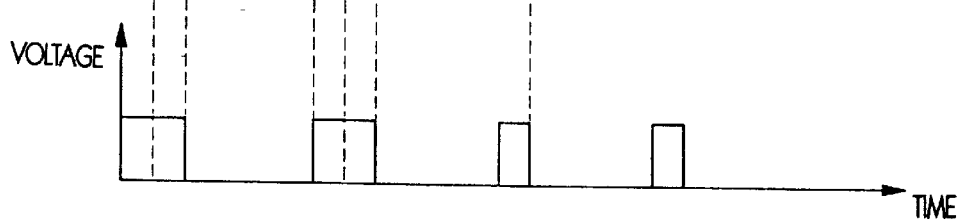

In case the user turns the turning knob in the counter-clock wise direction, the phase difference of the signal generated to the second output terminal (OUT12) as shown in FIG. 7b is 90 degrees faster than that of the signal generated to the first output terminal (OUT11) as shown in FIG. 7a. Then as the monostable multivibrator (31) will not be triggered in opposition to the case of the volume increase as has been explained, a low voltage will continuously be put out to the output terminal (Q) of the monostable multivibrator (31) as shown in FIG. 7c and a high voltage will continuously be put out to the output terminal (/Q) as shown in FIG. 7d. Whenever a high voltage is put out from the first output terminal (11) of the encoder (10), the monostable multivibrator (51) will be triggered, will put out pulse signals with the time constant (TW2) of the resistor (R21) and the capacitor (C17) to the output terminal (Q) referring to FIG. 7e and will put out pulse signals to the output terminal (/Q) as shown in FIG. 7f. As a low voltage is put out from the output terminal (/Q) of the above mentioned monostable multivibrator (51), the diode will conduct. Then the encoder will not act since low voltage is permitted to the base of the transistor (TR15), and it will be off. And the signals generated by the output terminal (Q) of the monostable multivibrator (51) and of the above mentioned monostable multivibrator (31) will be turned over through the inverter (33) (53) as shown in FIG. 7g and FIG. 7h.

Since the output signals of the above mentioned inverter (33) (53) is put in to the input terminal (IN11) (IN12) of the volume removal integrated circuit (90), the volume removal integrated circuit (90) will increase the volume in proportion to the numbers of the pulse signals generated by the inverter (53). As has been explained above in this invention the first and the second pulse generating means will act optionally according to the output signals of the encoder. The pulse signals will be given with already established width, and this enables the accurate volume regulation. And there will also not be any noise in the voice signal and as this invention does not need any high cost, the production cost can be decreased.

What is claimed is:

1. A volume regulator of an electronic voice output machine using separate pulse generations for increasing and decreasing volume, comprising:

an encoder having first and second output terminals, the encoder generating a first plurality of output signals from the first and second output terminals with a phase difference of ninety degrees between the first and the second output terminals, the encoder generating the first plurality of output signals in dependence upon instructions from a user regulating a volume;

a first pulse signal generating means generating a first plurality of pulse signals in dependence upon the output signals of said encoder when increasing the volume and not generating the first plurality of pulse signals when decreasing the volume;

a second pulse signal generating means generating a second plurality of pulse signals in dependence upon the output signals of said encoder when decreasing the volume and not generating the second plurality of pulse signals when increasing the volume;

a control means to prevent said encoder from generating the output signals when one of the first and second pulse signal generating means is generating the pulse signals; and a volume removal integrated circuit increasing and decreasing the volume in dependence upon the pulse signals generated by the first and second pulse signal generating means.

2. The volume regulator of claim 1, further comprising:

a first noise removal capacitor connecting said encoder and said first pulse signal generating means, said first capacitor filtering transmissions on a line connecting said encoder and said first pulse signal generating means; and a second noise removal capacitor connecting said encoder and said second pulse signal generating means, said second capacitor filtering transmissions on a line connecting said encoder and said first pulse signal generating means.

3. The volume regulator of claim 1, further comprising:
said first pulse signal generating means comprising
a first monostable multivibrator generating a first plurality of monostable signals with
a first plurality of predetermined pulse widths, said first pulse signal generating means being cleared in dependence upon the output signals generated from the first output terminal of said encoder and being triggered in dependence upon the output signals generated from the second output terminal of said encoder, and
a first inverter inverting the first plurality of monostable signals of said first monostable multivibrator into the first plurality of pulse signals and transmitting the first plurality of pulse signals to a first input terminal of said volume removal integrated circuit; and
said second pulse signal generating means comprising
a second monostable multivibrator generating a second plurality of monostable signals with a second plurality of predetermined pulse widths, said second pulse signal generating means being cleared in dependence upon the output signals generated from the first output terminal of said encoder and being triggered in dependence upon the output signals generated from the second output terminal of said encoder, and
a second inverter inverting the second plurality of monostable signals of said second monostable multivibrator into the second plurality of pulse signals and transmitting the second plurality of pulse signals to a second input terminal of said volume removal integrated circuit.

4. The volume regulator of claim 1, wherein said control means controls the connection and the disconnection of a standard terminal of said encoder to ground.

5. The volume regulator of claim 4, wherein said control means comprises:
an AND gate receiving the pulse signals from the first and second pulse signal generating means and generating a transistor control signal by logically adding the pulse signals received from the first and second signal generating means; and
a transistor connecting and disconnecting the standard terminal of said encoder, in dependence upon the transistor control signal received from said AND gate.

6. The volume regulator of claim 5, wherein said AND gate comprises:
a first diode connected to the first pulse signal generating means; and
a second diode connected to the second pulse signal generating means.

7. A method of regulating volume, comprising the steps of:
generating a first plurality of output signals from first and second output terminals with a phase difference of ninety degrees between the first and the second output terminals, said generating in dependence upon instructions from a user regulating the volume;
generating a first plurality of pulse signals in dependence upon the output signals generated during the step of generating the output signals from the first and second output terminals when increasing the volume, and not generating the first plurality of pulse signals when decreasing the volume;
generating a second plurality of pulse signals in dependence upon the output signals generated during the step of generating the output signals from the first and second output terminals when decreasing the volume, and not generating the second plurality of pulse signals when increasing the volume;
preventing from generating the output signals during the steps of generating the first plurality of pulse signals and generating the second plurality of pulse signals; and
increasing and decreasing the volume in dependence upon the pulse signals generated during the steps of generating the first plurality of pulse signals and generating the second plurality of pulse signals.

8. A volume regulator comprising:
an encoder having first and second output terminals;
a volume removal integrated circuit to control volume;
first pulse signal generating means comprising
a first monostable multivibrator generating a first plurality of monostable signals with a first plurality of predetermined pulse widths, said first pulse signal generating means being cleared in dependence upon output signals generated from the first output terminal of said encoder and being triggered in dependence upon output signals generated from the second output terminal of said encoder, and
a first inverter inverting the first plurality of monostable signals of said first monostable multivibrator into the first plurality of pulse signals and transmitting the first plurality of pulse signals to a first input terminal of said volume removal integrated circuit; and
second pulse signal generating means comprising
a second monostable multivibrator generating a second plurality of monostable signals with a second plurality of predetermined pulse widths, said second pulse signal generating means being cleared in dependence upon the output signals generated from the first output terminal of said encoder and being triggered in dependence upon the output signals generated from the second output terminal of said encoder, and
a second inverter inverting the second plurality of monostable signals of said second monostable multivibrator into the second plurality of pulse signals and transmitting the second plurality of pulse signals to a second input terminal of said volume removal integrated circuit.

9. The volume regulator of claim 8, comprising control means to prevent said encoder from generating the output signals when one of the first and second pulse signal generating means is generating the pulse signals.

10. The volume regulator of claim 8, further comprising:
a first noise removal capacitor connecting said encoder and said first pulse signal generating means, said first capacitor filtering transmissions on a line connecting said encoder and said first pulse signal generating means; and
a second noise removal capacitor connecting said encoder and said second pulse signal generating means, said second capacitor filtering transmissions on a line connecting said encoder and said first pulse signal generating means.

11. The volume regulator of claim 9, further comprising:
a first noise removal capacitor connecting said encoder and said first pulse signal generating means, said first capacitor filtering transmissions on a line connecting said encoder and said first pulse signal generating means; and a second noise removal capacitor connecting said encoder and said second pulse signal generating means, said second capacitor filtering transmissions on a line connecting said encoder and said first pulse signal generating means.

12. The volume regulator of claim 9, wherein said control means controls the connection and the disconnection of a standard terminal of said encoder to ground.

13. The volume regulator of claim 9, wherein said control means comprises:

an AND gate receiving the pulse signals from the first and second pulse signal generating means and generating a transistor control signal by logically adding the pulse signals received from the first and second signal generating means; and a transistor connecting and disconnecting the standard terminal of said encoder, in dependence upon the transistor control signal received from said AND gate.

14. The volume regulator of claim 12, wherein said control means comprises:

an AND gate receiving the pulse signals from the first and second pulse signal generating means and generating a transistor control signal by logically adding the pulse signals received from the first and second signal generating means; and a transistor connecting and disconnecting the standard terminal of said encoder, in dependence upon the transistor control signal received from said AND gate.

15. The volume regulator of claim 13, wherein said AND gate comprises:

a first diode connected to the first pulse signal generating means; and a second diode connected to the second pulse signal generating means.

16. The volume regulator of claim 14, wherein said AND gate comprises:

a first diode connected to the first pulse signal generating means; and a second diode connected to the second pulse signal generating means.

* * * * *